United States Patent [19]
Carlsson et al.

[11] Patent Number: 6,047,168
[45] Date of Patent: Apr. 4, 2000

[54] DEVICE AND METHOD FOR RADIO TRANSMITTERS

[75] Inventors: Torsten Carlsson; Martin Hellmark, both of Lund, Sweden

[73] Assignee: Telefonaktiebolaget LM Ericsson, Stockholm, Sweden

[21] Appl. No.: 08/880,740

[22] Filed: Jun. 23, 1997

[30] Foreign Application Priority Data

Jun. 28, 1996 [SE] Sweden ................................. 9602584

[51] Int. Cl.$^7$ .................................................. H04B 1/04
[52] U.S. Cl. .......................... 455/126; 455/91; 455/127; 330/285
[58] Field of Search .............................. 455/63, 70, 139, 455/205, 126, 127, 118, 119; 375/295, 298, 300; 370/215, 205, 206, 252; 332/144, 145; 330/284, 285

[56] References Cited

U.S. PATENT DOCUMENTS

| | | | |
|---|---|---|---|
| 4,367,443 | 1/1983 | Hull et al. ............................. | 330/207 P |
| 4,521,912 | 6/1985 | Franke et al. ........................... | 455/115 |
| 4,709,404 | 11/1987 | Tamura et al. .......................... | 455/126 |
| 5,109,538 | 4/1992 | Ikonen et al. ........................... | 455/127 |
| 5,129,098 | 7/1992 | McGirr et al. ........................... | 455/115 |
| 5,152,004 | 9/1992 | Vaisanen et al. ......................... | 455/68 |
| 5,307,512 | 4/1994 | Mitzlaff ................................... | 455/126 |
| 5,430,416 | 7/1995 | Black et al. ............................. | 332/145 |
| 5,452,473 | 9/1995 | Weiland et al. .......................... | 455/88 |
| 5,526,528 | 6/1996 | Kurisu . | |
| 5,646,578 | 7/1997 | Loh et al. ................................ | 330/279 |
| 5,655,220 | 8/1997 | Weiland et al. .......................... | 455/69 |
| 5,815,805 | 9/1998 | Crnkovic et al. ......................... | 455/78 |
| 5,880,635 | 3/1999 | Satoh ...................................... | 330/144 |

FOREIGN PATENT DOCUMENTS

WO 95/23453  8/1995  WIPO .

OTHER PUBLICATIONS

V. Petrovic W. Gosling, Polar–Loop Transmitter, Electronic Letters, 10th May 1979, vol. 15, No. 10, pp 286–287.

V. Petrovic et al., Reduction of Intermodulation Distortion by Means of Modulation Feedback, IEE Collocquim on Intermodulation, Apr. 9, 1984, pp 8/1–8/8.

*Primary Examiner*—Dwayne D. Bost
*Assistant Examiner*—Sonny Trinh
*Attorney, Agent, or Firm*—Burns, Doane, Swecker & Mathis, L.L.P.

[57] ABSTRACT

The present invention relates to a device and a method in a transmitter stage in a radio transmitter for modulating and amplifying an information signal for further transmission through a radio channel. The transmitter stage in the radio transmitter comprises a converting device (5) PCH, an amplifier control device (8) PAC, a power detector (13) and a power amplifier (2). Examples of the problems solved by the present invention are difficulties in reducing the power consumption, non-linearities in the output signal when using non-linear amplifiers in radio transmitters, and achieving a high signal-to-noise ratio in the output signal without connecting filter arrangements after such an amplifier. The solution according to the inventive method and device utilizes an information signal which has in earlier steps been divided in its polar components: a phase reference component signal ($E_{phr}$) and an amplitude component signal ($A_{amp}$). The phase reference component phase modulates a low noise high power signal source which has a constant amplitude. The amplitude of the obtained signal is then formed in an amplifier, which is controllable with the amplitude component signal ($A_{amp}$). Its current consumption is registered and compared to a control value for the current. The amplifier is controlled towards this control value.

21 Claims, 4 Drawing Sheets

6,047,168

DEVICE AND METHOD FOR RADIO TRANSMITTERS

TECHNICAL FIELD

The present invention relates to a radio transmitter for transmitting an information signal which has been split into its phase and amplitude components before it is upconverted to a channel frequency and amplified. The invention also relates to a method in a transmitter stage in a radio transmitter for modulating and amplifying an information signal for further transmission through a radio channel.

STATE OF THE ART

An information channel in, for example, a mobile telecommunications system comprises binary encoded information and/or binary encoded signalling protocols. Before the signal is modulated onto a carrier wave having an intermediate frequency or channel frequency, it is referred to as a base band signal. In some known radio transmitters for transmission of a digital information signal, the base band signal is split into an I signal and a Q signal. These two signals together define an information vector. The position or motion of the information vector in a Cartesian co-ordinate system represents the information signal. One example is the so called $\pi/4$ QPSK modulation. The I and Q signals are modulated onto a carrier wave using an IQ modulator. The output signal from the IQ modulator can be further upconverted using subsequent frequency mixers. The carrier wave thereby comprises the amplitude and phase components of the modulating signal. The modulator works on relatively low power levels compared to the levels transmitted via the aerial. The necessary amplification between the IQ modulator and the aerial must be linear. Non-linear amplification generates distortion in the aerial signal. The distortion will cause a vector error in the vector carrying the information signal and, in the worst case, a broadening of the frequency spectre of the emitted signal.

The signal-to-noise ratio for an output signal from an IQ modulator is generally so low that filtering of the carrier wave signal is necessary to avoid the emission of broadband noise.

Attempts have been made to solve the mentioned problem of linearity in various ways. Linear amplifiers have been used, but their efficiency is too low for them to be an alternative to non-linear amplifiers. Another solution that has been tried is to distort the I and Q components respectively, beforehand, so that an undistorted signal is received by the aerial. This method is difficult to implement. A third method used is Cartesian feedback, which means that the I and Q signals on the output of the last amplifier are fed back and compared to the desired I and Q signals.

None of the above solutions solves both the broadband noise problem and the problem of too low efficiency.

It is previously known how to split an information signal in polar components—in a phase reference component and an amplitude reference component. This technique is previously known, for example from the international patent application WO, A1, 95/23453. In this document a power amplifier with feedback of the output signal is disclosed. The amplifier is a final stage in a radio transmitter for transmission of signals having both a phase modulated component and an amplitude modulated component. For this both phase and amplitude modulation circuits are needed.

This previously known radio transmitter has certain severe drawbacks, which will be discussed in the following.

The control of the amplitude modulation is achieved by the generation of an error signal from the difference between the amplitude component signal and a part of the output signal from the amplifier. These two signals are very different. The feedback signal is amplified and has a radio frequency (RF). Heavy requirements are therefore made on the circuits that are to adapt these two signals and generate an error signal. To be able to handle signals with high radio frequencies, special circuitry is needed. Using this kind of circuitry makes the manufacturing significantly more expensive.

The feedback of the RF signal in the radio transmitter mentioned uses an envelope detector with limited dynamics, which in turn leads to impaired dynamics in the radio transmitter and impaired temperature stability. In mobile telephony, but also in certain other fields of use, the requirements on dynamics and temperature stability are very high. Also, envelope detectors are non-linear components, which means that both the feedback signal and the amplitude modulated signal are distorted.

The compression point of the power amplifier becomes dependant of the aerial load, which significantly increases the risk for so called saturation in this type of control system. The feedback also means a power loss in the output signal, which is not desirable in a battery driven radio transmitter. To eliminate broadband noise an additional filter arrangement is needed after the amplifier.

From the document "Polar-Loop Transmitter" (V. Petrovic, W. Gosling, Electronic Letters, May 10, 1979, Vol. 15, No. 10, pp 286–287) as well, a transmitter with a phase loop, an amplitude loop and an amplitude detector is previously known.

SUMMARY OF THE INVENTION

The problems that are attempted solved by the present invention are the difficulties of reducing the power consumption, non-linearities in the output signal when non-linear amplifiers are used in radio transmitters, and achieving a high signal-to-noise ratio in the output signal without connecting a filter arrangement after such an amplifier.

The present invention also attempts to solve the previously mentioned problems concerning dynamics and temperature stability in radio transmitters, particularly in radio transmitters with feedback of a radio frequency signal (RF signal).

The object of the present invention is to enable the use of a very power-efficient amplifier, which is allowed to be non-linear, and still obtain a high signal-to-noise ration without power consuming filter arrangements after the final amplification.

It is also an object to eliminate the drawbacks and deficiencies mentioned, found in radio transmitters of the known kind, which have been described, for example, by Petrovics et al. and in patent application WO, A1, 9523453.

It is another object to suggest a solution to the previously mentioned problems of dynamics and temperature stability in radio transmitters.

The solution according to the inventive method and device utilizes an information signal which has in previous stages been split in its polar components: a phase reference component and an amplitude component. The phase reference component phase modulates a signal source of constant amplitude. The amplitude of the resulting signal is then formed in a controllable amplifier. Its current consumption is registered and compared to a control value for the current.

The amplifier is controlled towards this control value. What is not previously known is controlling and monitoring the output power by registering the current consumption in a transmitter of this kind.

In somewhat more detail the solution according to the inventive method and the inventive device is described below. The inventive radio transmitter comprises a transmitter stage comprising a conversion device, an amplifier control device, a power amplifier and a power detector. An information signal has been split into two components before the transmitter stage: a phase reference component signal and an amplitude component signal. The phase reference component signal is connected to the converting device, which generates a pure phase modulated signal of constant amplitude and with the appropriate carrier frequency to the amplifier, which amplifies and outputs the signal as an aerial signal to an aerial with associated circuitry. This signal is fed back to the converting device so as to phase lock the aerial signal to the phase reference component signal. The output power from the amplifier and the amplitude of the aerial signal are controlled by the amplitude component signal and a control value signal for the output power. A power detector senses the current consumption of the amplifier and outputs an true value signal to the control device of the amplifier. The true value signal is a measure of the output power, as there is a specific correlation between the output power and the current consumption.

These signals are connected to the amplifier control device which, depending on the signals, generates an amplifier control signal, which is connected to the amplifier.

Advantages are obtained in that the transmitter design does not include components such as radio frequency detectors or non-linear components such as envelope detectors. Because of this, the problems concerning temperature variations, saturation and dynamics are reduced. Step up and step down, respectively, of the amplification can therefore be made faster and more stable. Transients in the envelope of the output signal are reduced, and thus the bandwidth of the output signal is limited.

Registration of the current reduces the risk of saturation of the power amplifier.

Thus, other advantages of the inventive transmitter and amplifier are better signalling properties and better efficiency. The transmitter also becomes smaller in size than previously known transmitters. Above all, improved linearity, minimized need of bandwidth and reduced disturbance between adjacent channels are achieved, particularly at fast step up and step down and high power outputs.

A further advantage of the inventive transmitter and method is that the broadband noise from sources before the phase detector is filtered in a better way.

The inventive transmitter and method also offers advantages such as fast and reliable phase locking and low phase distortion at fast and big changes in output power, and also at high output power levels.

The invention will now be described in more detail by means of preferred embodiments and with reference to the accompanying drawings.

PREFERRED EMBODIMENTS

Figure 1:
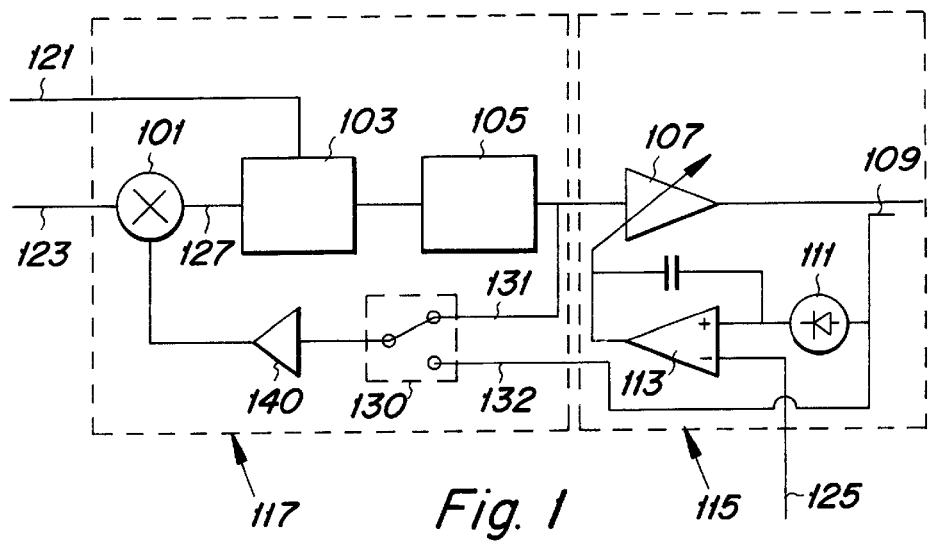
FIG. 1 is a block diagram of a previously known radio transmitter stage comprising a power amplifier with feedback of the output signal.

In FIG. 1 a block diagram of a previously known transmitter is shown. In principle, this transmitter is divided in a phase modulation control loop 117 and an amplitude modulation control loop 115. The amplitude modulation control loop comprises a power amplifier 107, a directional coupler 109, an envelope detector 111 and a difference amplifier 113. The directional coupler 109 feeds back part of the output power of the output terminal of the power amplifier. The directional coupler is connected to the envelope detector 111, which is in turn connected to one of the signal input terminals of the difference amplifier 113. On the other signal input terminal an amplitude reference signal 125 is connected. The difference amplifier 113 generates a voltage difference signal as a result of the difference between the two signal input terminals. The difference amplifier is connected to an amplitude modulation input terminal on the power amplifier 107. The amplitude modulation of the output signal from the power amplifier is achieved by varying the voltage of the amplitude reference signal.

The frequency translation of a phase reference signal 121 to the appropriate channel frequency has been solved in this prior art device by the phase modulation control loop 117. The loop comprises a mixer 101, a phase detector 103 and a voltage controlled oscillator, VCO, 105, and a feedback connection 131 from the output terminal of the oscillator to a switching circuit 130. As previously mentioned, non-linear amplifiers show heavy phase distortion at high power. This distortion may be counteracted by a feedback connection 132 which is connected to the output terminal 109 of the power amplifier and which thereby includes the power amplifier in the phase modulation control loop. By introducing a switching circuit 130 in the phase modulation control loop it is possible to switch between the two feedback loops 131 and 132. One of the feedback signals is fed back to the mixer 101. The mixer generates an intermediate frequency signal 127, the frequency of which is equal to the difference between a frequency reference signal 123 and the feedback signal from the switching circuit 130. The phase detector 103 generates an error signal, which depends on the phase difference between the intermediate frequency signal 127 and the phase reference signal 121. The error signal is connected to the frequency control input terminal of the oscillator. Thus, the output signal from the oscillator obtains a phase which is approximately equal to the phase of the phase reference signal 121, which means that the output signal has been phase modulated by the phase reference signal 121. The frequency of the output signal depends on the sum of, or the difference between, the frequency of the frequency reference signal and the frequency of the phase reference signal.

It is, however, impossible in practice to quickly lock to the correct phase by switching in the previously known way. The problems occur if the step up or step down of the output power is made very fast. The switch will cause a phase disturbance which will not die away fast enough. In the worst case the loop will lose its locking.

Figure 2:
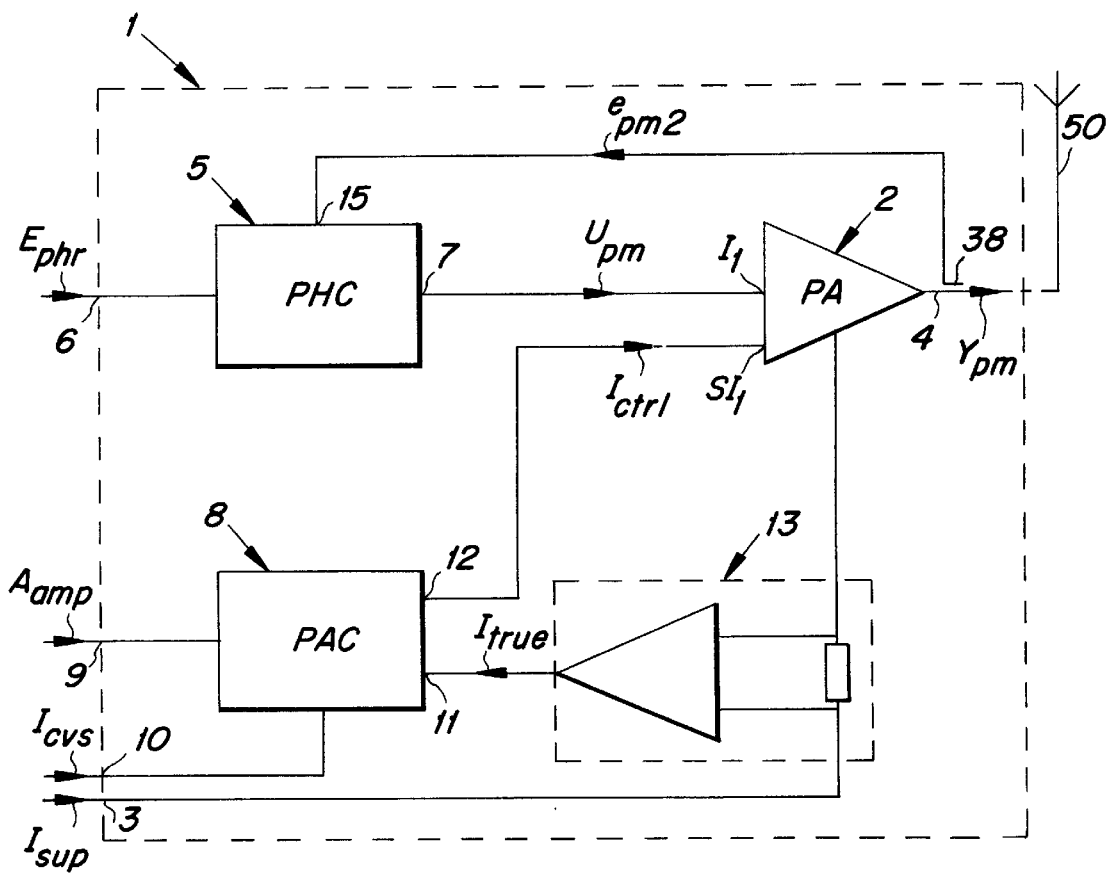
FIG. 2 shows, in the form of a block diagram, the principles of the inventive transmitter stage.

FIG. 2 gives an overall picture of the construction of the inventive radio transmitter stage 1. In principle the transmitter stage 1 is divided in a phase modulation control loop 5, denoted in the figure as PHC, an amplifier control device 8 for signal processing and control of the output power, denoted PAC, a power amplifier 2 and a power detector 13. The transmitter stage 1 is connected to other parts, not shown, of a radio transmitter through its input terminals 3, 6, 9 and 10. The transmitter stage 1 is also connected to an aerial 50 through an output terminal 4, which is common to the power amplifier and the transmitter stage.

From a power supply device (not shown in the figure) such as a voltage source (battery etc.), a current $I_{sup}$ is fed to the power amplifier 2 through the supply current input terminal. The task of the power amplifier is to amplify an incoming modulated signal $U_{pm}$ at an input terminal $I_1$, to a power determined by an amplifier control signal $I_{ctrl}$ at an input terminal $SI_1$ of the power amplifier. The phase modulation control loop 5 PHC functions as a converting device for phase locking and frequency conversion and emits the signal $U_{pm}$ on an output terminal 7 through a connection to the power amplifier 2. The signal $U_{pm}$, which holds phase modulated information and the correct channel frequency, and has a constant amplitude, is shaped (in some applications it is amplitude modulated if this is desirable) and amplified by the amplifier 2 to an aerial signal $Y_{pm}$. The signal $Y_{pm}$ is determined in part by the phase modulated signal $U_{pm}$ on the input terminal $I_1$, in part by the amplifier control signal $I_{ctrl}$ on the input terminal $SI_1$ of the amplifier. The output terminal 4 of the power amplifier is connected to the aerial 50, either directly or through appropriate circuitry (such as filters, adaptation circuits etc.).

According to the invention the current consumption $I_{sup}$ is detected by means of the power detector 13, which in turn outputs an electric value $I_{true}$, which is proportional to the current $I_{sup}$. The power detector has an output terminal which is connected to one of the input terminals of the amplifier control device 8, an input terminal 11. The amplifier control device 8 compares the signal $I_{true}$ to an amplitude component signal $A_{amp}$ and a control value $I_{cvs}$, which is a signal denoting a control value of the output power. The signal $I_{cvs}$ is connected to the amplifier control device input 10. The amplitude component signal $A_{amp}$ is connected to the control device 8 at an input terminal 9.

The control device 8 combines the contributions of the different input signals together and emits from the output terminal 12 the amplifier control signal $I_{ctrl}$ to the control input terminal $SI_1$ of the power amplifier. In the inventive radio transmitter the modulated RF signal $U_{pm}$ is generated from a phase reference component signal $E_{phr}$ in the phase modulation control loop 5, which is a conversion device, which both frequency converts and phase locks the incoming signal $E_{phr}$.

Figure 3:
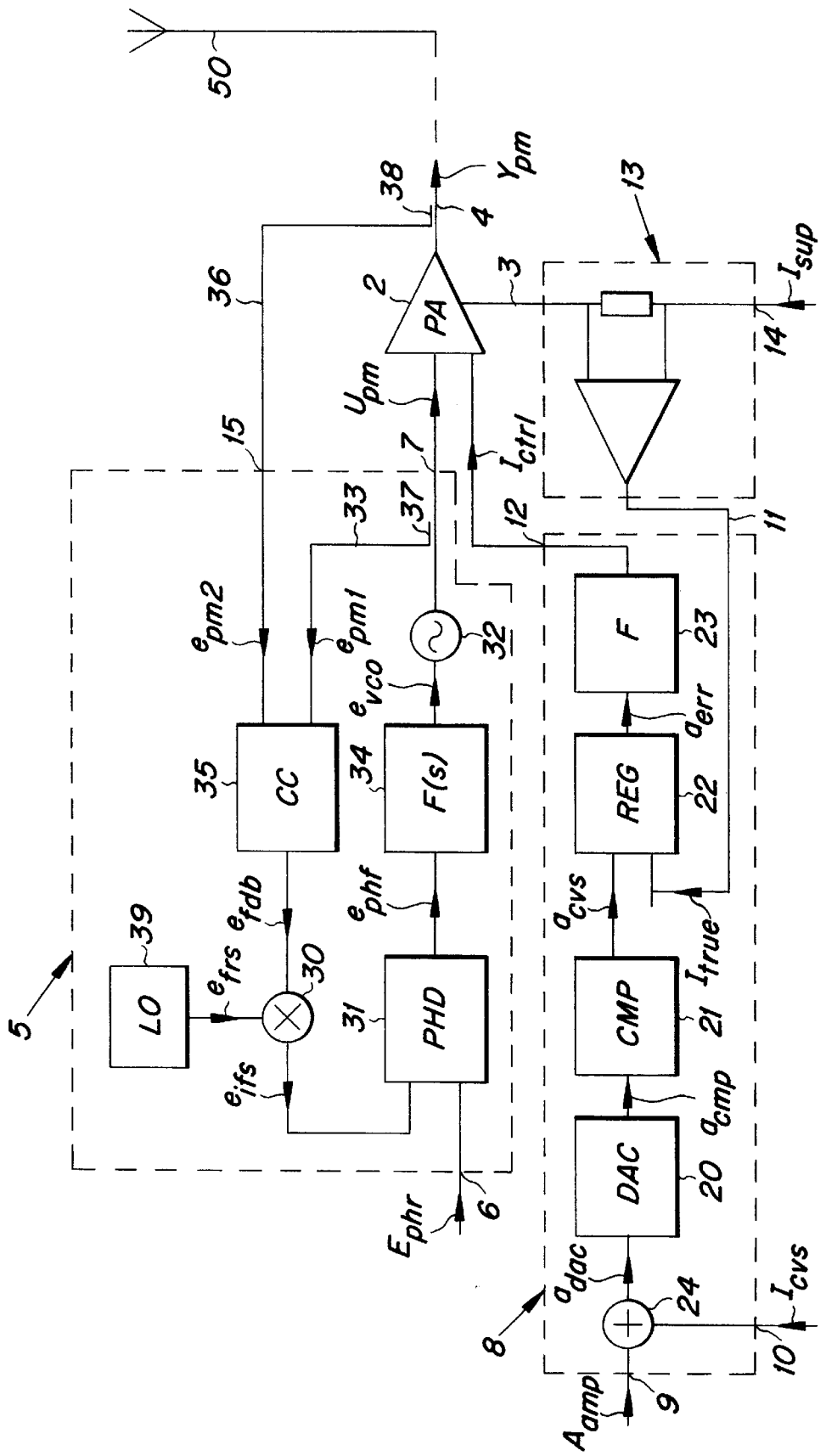
FIG. 3 is a block diagram of the inventive transmitter stage in detail.

The amplifier control device 8 PAC for signal processing and control of the output power, and the phase modulation control loop 5 PHC, may be implemented in several ways. In FIG. 3 a preferred embodiment of the transmitter stage 1 is shown, which will be described in the following.

In this embodiment the amplifier control device 8 comprises an digital-to-analogue converter 20 DAC, an compensation circuit 21 CMP, an amplitude controller 22 REG and a control filter 23 F. How these cooperate constructively to control the output power and the amplitude from the amplifier will now be explained.

The amplitude component signal $A_{amp}$ and the control value $I_{cvs}$ on the input terminals 9 and 10 respectively are binary encoded signals which determine the output signal amplitude and the output power from the power amplifier 2. The amplitude component signal $A_{amp}$ and the control value signal $I_{cvs}$ are added in an adding device 24 to form a new binary encoded signal $a_{dac}$.

Because the power amplifier 2 is built using analogue technology, digital signals must be converted to analogue ones. This is done with the D/A converter 20 DAC, which converts the signal $a_{dac}$ to a voltage signal $a_{cmp}$. This voltage constitutes a reference voltage to the following amplitude controller 22. The output signal $a_{cmp}$ from the converter 20 proportional to the amplitude expressed in dB.

To compensate for the non-linear relationship between the current consumption and the output voltage (in dB) of power amplifiers with high efficiency, the signal $a_{cmp}$ is connected to the compensation circuit 21 CMP between the D/A converter 20 DAC and the amplitude controller 22 REG. The transfer function of the circuit is adapted to the power amplifier in such a way that said relationship becomes linear.

In this case an exponential function may be an appropriate adaptation. An output signal $a_{cvs}$ from the compensating circuit 21 to the amplitude controller 22 is thus an adapted reference voltage and is in the following called the amplitude control value signal. To the controller 22 another signal is also connected, which is in this connection called true value $I_{true}$. The signal is an output signal from a power detector 13 which senses or measures the power consumption of the power amplifier 2. The power detector 13 is connected to the power input terminal 3 of the power amplifier and the detector 13 emits the true value $I_{true}$, a voltage signal which is proportional to the current in the current input to the amplifier 2. The amplitude control value signal $a_{cvs}$ and the true value $I_{true}$ are connected to input terminals on the amplitude controller 13. The amplitude controller 22 may be a difference amplifier, which means that the difference between the two input signals will be an error signal $a_{err}$. This error signal is filtered from noise in the control filter 23 and constitutes the amplifier control signal $I_{ctrl}$, which is connected to the control input $SI_1$ of the amplifier.

In the following the frequency translation of the phase reference component signal $E_{phr}$ to the correct channel frequency will be described.

In FIG. 3 a preferred embodiment of the phase modulation control loop 5 is also shown, which because of its function may be seen as a conversion device for phase locking and frequency conversion. This embodiment also offers a very effective compensation for phase distortion.

As an input signal to the device a phase reference component signal $E_{phr}$ is used, which is a signal in which the information is held in the phase. The phase reference component signal comprises the phase information to be modulated and transmitted onto an appropriate carrier frequency.

The frequency conversion of the phase reference component signal $E_{phr}$ to the correct channel frequency takes place in a phase modulation control loop for phase locking and frequency conversion. The loop comprises a mixer 30, a phase detector 31, a voltage controlled oscillator 32 (VCO), an integrating filter circuit 34, the combination circuit 35, and a feedback connection 33 from the output terminal of the oscillator 32 through a first branching device 37 to a first input terminal of a combination circuit 35. The oscillator 32 is connected to an input terminal $I_1$ of the power amplifier 2, the output terminal 4 of which is connected to the aerial 50. The phase modulation control loop 5 also has a second feedback connection 36 from the output terminal 4 of the power amplifier 2 through a second branching device 38 to a second input terminal of the combination circuit 35.

The combination circuit 35 may either be a circuit with only passive components or a circuit with active components (transistors). A voltage divider in which only resistors have been used as components is an example of a circuit with only passive components. In some circumstances it may be more advantageous to use active components. The combination circuit may then be implemented as an amplifier. It should be pointed out that there are other solutions than the ones stated above to how a combination circuit should be designed.

The mixer 30 generates an intermediate frequency signal $e_{ifs}$, the frequency of which is equal to the difference between a frequency reference signal $e_{frs}$ from a frequency synthesizer 39 and a feedback signal $e_{fdb}$ from the combination circuit 35.

The phase detector 31 generates an error signal $e_{phf}$, which depends on the phase difference of the intermediate frequency signal $e_{ifs}$ and the phase reference component signal $E_{phr}$. To reduce the risk of phase distortion, noise transmission and bandwidth broadening as a result of broadband noise, the integrating filter circuit 34 is connected between the phase detector 31 and the voltage controlled oscillator 32. The filter circuit effectively eliminates broadband noise. The noise originates from sources before the phase detector. Such a source may be an IQ modulator, which is used in certain types of radio transmitters.

The error signal $e_{phf}$ is connected to the input of the filter circuit 34, and from this circuit a signal $e_{vco}$ is connected to the frequency control input of the oscillator 32. In this way the output signal $U_{pm}$ from the oscillator 32 obtains a phase which is approximately equal to the phase of the phase reference component signal $E_{phr}$, which means that the output signal $U_{pm}$ is phase modulated with the phase reference component signal $E_{phr}$. The frequency of the output signal $U_{pm}$ is equal to the sum of or the difference between the frequency of the frequency reference signal $e_{frs}$ and the frequencies of the phase reference component signal $E_{phr}$.

The signal $U_{pm}$ is connected to the power amplifier 2, which amplifies the signal $U_{pm}$ in dependence of the amplifier control signal $I_{ctrl}$. An aerial signal $Y_{pm}$ on the output 4 of the amplifier 2 to the aerial 50 then obtains the shape determined by the amplifier control signal $I_{ctrl}$.

The combining device, the combination circuit 35, obtains both a part of the signal $U_{pm}$, in the figure denoted $e_{pm1}$, and a part of the signal $Y_{pm}$, in the figure denoted $e_{pm2}$, each through one of the devices 37 and 38 respectively, for branching of signals. These devices may be designed as directional couplers or some form of voltage dividers (capacitive or resistive pin). The two loops, 33 and 36 respectively, connect the devices 37 and 38 respectively, each to one of the input terminals of the combination circuit 35. This circuit combines the two signals $e_{pm1}$ and $e_{pm2}$ from the appropriate loop to the above mentioned feedback signal $e_{fdb}$ in the loop. The devices 37 and 38 branch a certain part of the signals $U_{pm}$ and $Y_{pm}$ respectively. These devices may also be controllable. The fraction of the respective signal which is branched can thus be controlled individually, which may be an advantage. An example of the mentioned devices, is controllable directional couplers.

Before the step up of the power amplifier PA 2 is started, the loop is locked to the output signal of the voltage controlled oscillator 32 by means of the first feedback loop 33. As the output power increases in dependence of the control signal $I_{ctrl}$, the feedback signal $e_{pm2}$ from the output of the power amplifier through the second feedback loop 36 will gradually dominate in the feedback signal $e_{fdb}$ over the feedback oscillator signal $e_{pm1}$ through the first feedback loop 33.

Without the loop 33 phase locking is not obtained at start-up of the transmitter in good time before the power amplifier is activated. If the bandwidth of the loop is sufficiently high, the loop will have time to compensate for the phase shift in the power amplifier 2 during the step up of the output power. A feedback connection through the loop 36 must have been established and the mentioned locking obtained in order to achieve the desired phase distortion compensation at approximately 10 dB at full output power.

The method for compensating for the phase distortion according to this embodiment implies that both the signals $e_{pm1}$ and $e_{pm2}$ from each of the loops 33 and 36 respectively, are combined to form the new feedback signal $e_{fdb}$ in the loop. If the amplification in the amplifier 2 is changed, then the share, and the dominance of the branched and feedback signals in the feedback signal to the phase lock and upconversion loop also change. This method gives a smooth and continuous transition between each feedback signal's share of and thereby dominance in the total feedback signal so that the phase modulation control loop may be phase locked in time before a fast change of the output power of the power amplifier starts. The method also implies that the dominance of the signal branched and fed back from the output terminal of the power amplifier 2 increases in the new feedback signal as the output power of the power amplifier increases. The feedback signal from the output terminal of the power amplifier dominates in the new feedback signal when the power amplifier amplifies at full output power, but the feedback signal from the input terminal of the power amplifier dominates in the new feedback signal when the output power of the power amplifier is low.

Through this described method, the phase modulation control loop 5 is locked to the modulating signal $U_{pm}$ on the input terminal of the power amplifier before the output power of the power amplifier is increased. When the step up of the amplifier has started, the phase locking and upconversion loop is locked to the amplified modulated signal on the input terminal of the power amplifier, before the output power of the power amplifier has reached full output power.

Figure 4:
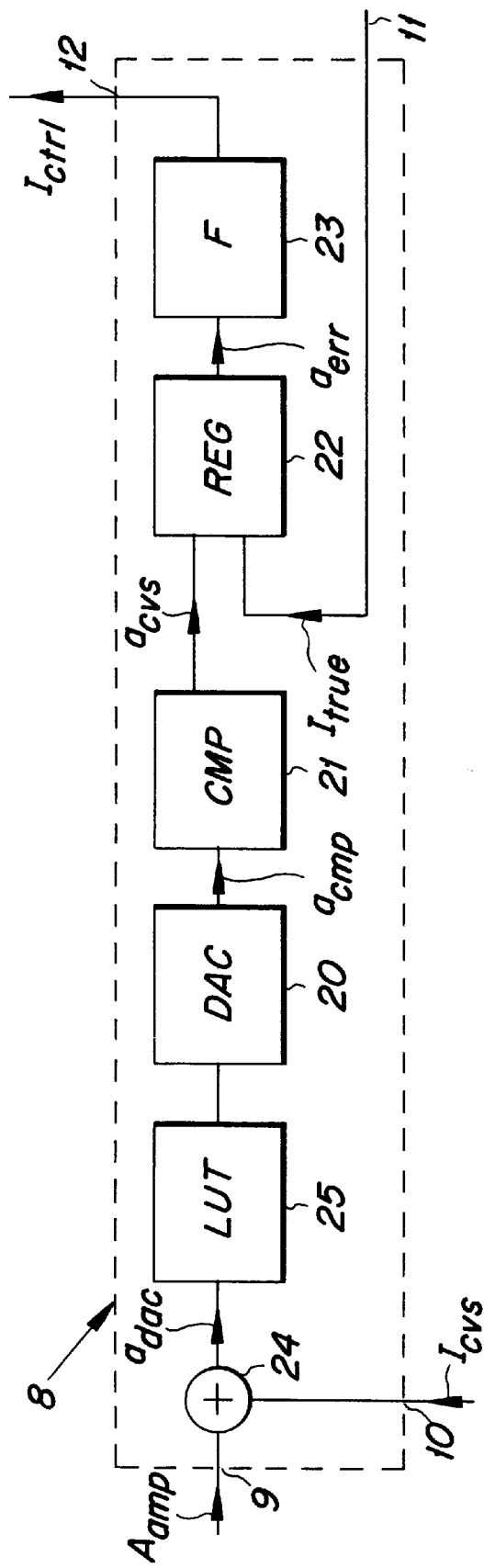
FIG. 4 is a block diagram of an alternate embodiment of an amplifier control device in the transmitter stage.

Another embodiment of the transmitter stage 1 is presented in FIG. 4. Only the amplifier control device 8, which has been modified, is shown. In all other aspects the transmitter stage is similar to the one shown in FIG. 3.

By comparison, there are obvious differences between the state of the art as described and the present invention. In the prior art device the amplitude of the output signal is registered and the amplification is controlled in relation to the feedback of this output signal. The disadvantages of such a method and such a design have been described above. In the present invention the supply current to the power amplifier is registered and controlled. The invention makes it possible to utilize the connection between the output power and the supply current to control the amplitude and the output power. The advantages of a method and a design according to the invention have also been described previously. A comparison also reveals differences in the design and function of the amplifier control device 8. The prior art device also does not have a combination circuit 35 which enables the combination of two feedback signals to one new feedback signal $e_{fdb}$. This combination circuit enables the smooth change of the mutual dominance of the two feedback signals.

In this embodiment of the amplifier control device 8 the adding device 24, the D/A converter 20 DAC, the compensation circuit 21 CMP, the amplitude controller 22 REG and the control filter 23 F are comprised. The amplifier control device 8 also comprises the input terminal 9 for the amplitude component signal $A_{amp}$, the input terminal 10 for the control value $I_{cvs}$ and the input terminal 11 for the true value signal $I_{true}$, and an output terminal 12 for the amplifier control signal $I_{ctrl}$. This output terminal is connected to the control input terminal of the amplifier $SI_1$. What distinguishes this embodiment from the previously presented embodiment according to FIG. 3, is that a table unit 25 LUT is also comprised in the circuit solution. The table unit 25 is connected between the adding device 24 and the D/A converter 20. In the following, its function in this embodiment will be described.

The two binary encoded signals, the amplitude component signal $A_{amp}$ on input 9 and the control value $I_{cvs}$ on the input 10, are added to each other in the adding device 24 to a new binary encoded signal $a_{dac}$. This new signal comprises amplitude information from the amplitude component signal $A_{amp}$, and also information about the output power and the operating point of the power amplifier. There is a non-linear connection between the current consumption and the output voltage (in dB) of power amplifiers with high efficiency. This connection is known, but it varies with the variation of the operating point of the power amplifier. This variation may be illustrated if the connection between the current consumption and the output voltage (in dB) is drawn graphically as curves for the operating points. The variation in the connection may, however, be compensated for by means of the table unit 25, the memory of which holds compensation values stored for different operating points. By means of the table unit 25, a constant connection may thus be kept over a relevant operating area of the amplifier 2. The table unit 25 may be a so called look-up table LUT. These are particularly useful because they are fast. The output signal from the table unit is connected to the D/A converter 20. Apart from this, this embodiment of the amplifier control unit 8 works in the same way as previously shown in FIG. 3.

Figure 5:
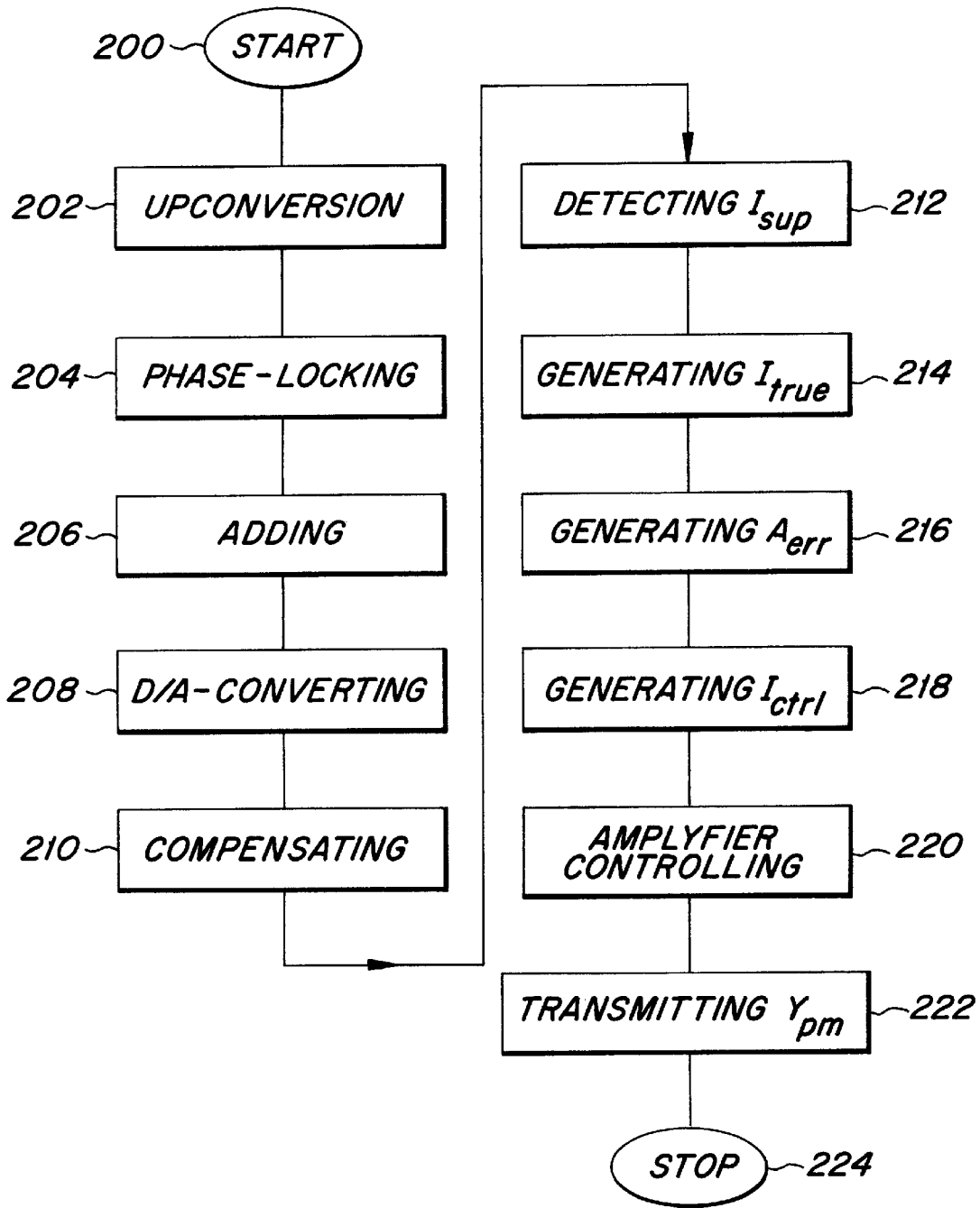
FIG. 5 is a flow chart of the inventive method.

FIG. 5 shows a flow chart presenting the inventive method step by step.

The method starts by an information signal, which has been split into a phase reference component signal $E_{phr}$ and an amplitude component signal $A_{amp}$, coming in to the transmitter stage 1 in the radio transmitter. In a first step, 202, the phase reference component signal $E_{phr}$ is upconverted in the conversion device 5 to a phase modulated RF signal $U_{pm}$. Then, in step 204, a phase locking is performed by a voltage controlled oscillator 32 comprised in the conversion device 5, to generate the phase modulated RF signal $U_{pm}$.

The binary encoded amplitude component signal $A_{amp}$ and a binary encoded control value signal $I_{cvs}$ are added to form a new binary encoded signal $a_{dac}$, as stated in step 206. Then, in step 208, a conversion of the binary encoded signal $a_{dac}$ takes place in a digital to analogue converter 20 to an analogue signal $a_{cmp}$. Then, in step 210, a compensation is carried out for the non-linear connection between the supply current $I_{sup}$ and the output power $P_{out}$, measured in the unit [dBm], in the aerial signal $Y_{pm}$, said compensation being carried out with a suitable compensation function implemented in the compensation circuit 21. The compensation circuit 21 corrects the analogue signal $a_{dac}$ and generates the amplitude control value signal $a_{cvs}$, which is proportional to the output power (in dBm) from the amplifier.

The power detector 13 detects the supply current $I_{sup}$ to the power amplifier 2 as stated in step 212. The power detector 13 then generates the true value signal $I_{true}$, in step 214. The amplitude control value signal $a_{cvs}$ and the true value signal $I_{true}$ are compared in the next step, 216, by means of an amplitude controller 22, in which the error signal $a_{err}$ is generated as a result of this comparison. In step 218 the control filter 23 filters the error signal $a_{err}$ and generates the amplifier control signal $I_{ctrl}$. In step 220 this amplifier control signal $I_{ctrl}$ controls the power amplifier 2, and the power amplification of the phase modulated RF signal $U_{pm}$, so that the power amplifier generates the aerial signal $Y_{pm}$. Finally the aerial signal $Y_{pm}$ is connected to the aerial 50 for further transmission over a radio channel, in step 222. The method ends in step 224, when the transmission is finished. In mobile telephony applications this may correspond to the end of a time slot.

Finally, it should be pointed out that both the phase modulation control loop 5 and the amplifier control device 8 according to the described embodiments and the described method are necessary to solve the listed problems in a radio transmitter. The proposed solutions also give the advantages and achieve the objects which were stated and which have been desirable in addition to what has previously been possible in view of the state of the art.

We claim:

1. A radio transmitter for transmission of an information signal over a radio channel, said transmitter comprises a transmitter stage comprising:

a power amplifier with a current supply and at least one input for a phase modulated signal and a control input, and an aerial signal output for emission of an aerial signal to an aerial;

a conversion device for phase locking and frequency conversion, said conversion device comprising;

a phase signal input terminal for receiving a phase reference component signal, said phase reference component signal is a component of said information signal, and an RF signal output terminal for the emission of the phase modulated RF signal to the input terminal of said power amplifier; and an amplifier control device for signal processing and output power control comprising;

an amplitude input terminal for receiving and amplitude component signal which is a component signal of said information signal, a control value input terminal for receiving a control value signal which indicates the desired output power from the power amplifier, a true value input terminal for receiving a true value which is a measure of the output power of said power amplifier, and an output terminal connected to said control input of said power amplifier, wherein a power detector is connected to said current supply of said power amplifier to register the current consumption, to form said true value signal and to emit said true value signal to said amplifier control device where an amplifier control signal is generated as a function of the amplitude component signal, the true value signal and said control value and is emitted to the control input of said power amplifier.

2. A radio transmitter for transmitting an information signal over a channel according to claim 1, wherein said power amplifier, said power detector and said amplifier control device form a closed loop.

3. A radio transmitter according to claim 1, wherein said conversion device for phase locking and frequency conversion further comprises a low-noise high-power voltage controlled oscillator.

4. A radio transmitter according to claim 1, wherein said amplifier control device for signal processing and output power control further comprises a D/A converter.

5. A radio transmitter according to claim 1, further comprising; a frequency synthesizer which generates a frequency reference signal.

6. A radio transmitter according to claim 1, wherein said radio transmitter transmits on a radio channel for mobile telephones.

7. A radio transmitter according to claim 1 wherein said conversion device for phase locking and frequency conversion further comprises;
a combination circuit for combining a signal branched from the input of said power amplifier and a signal branched from said output of said power amplifier to a feedback signal.

8. A radio transmitter according to claim 1, wherein said amplifier control device further comprises a table unit.

9. A radio transmitter according to claim 1, wherein said amplifier control device further comprises a compensation circuit.

10. A radio transmitter according to claim 1, wherein said conversion device for phase locking and frequency conversion obtains a frequency reference signal from a source arranged outside said conversion device.

11. A method in a transmitter stage of a radio transmitter to modulate and amplify and information signal to an aerial signal for further transmission, wherein said information signal is split into a phase reference component signal and an amplitude component signal, said method comprising:
adding said amplitude component signal and a control value signal to form a first signal;
converting said first signal in a digital/analog converter to an analog signal;
compensating for a non-linear connection between a supply current and an output power in said aerial signal with a compensation function implemented in a compensation circuit which corrects said analog signal to an amplitude control value signal which is proportional to the output power from said amplifier;
detecting a supply of current to said power amplifier;
generating a true value signal in a power detector;
comparing said amplitude control value signal to said true value signal by means of an amplituded controller;
generating an error signal based upon said comparing step;
filtering said error signal and generating and amplifier control signal so that an aerial signal is generated; and
connecting said aerial signal to an aerial for further transmission through said radio channel.

12. A method according to claim 11, further comprising the step of;
adjusting a new binary encoded signal using a table value unit of a look-up-table type.

13. A method according to claim 11, further comprising the step of;
compensating for phase distortion in said aerial signal.

14. A method according to claim 13, further comprising the steps of;
phase locking a voltage controlled oscillator located in said conversion device, said oscillator generating a phase modulated RF signal;
compensating for phase distortion in said aerial signal by carrying out the phase locking in said conversion device before the output power of the power amplifier is changed.

15. A method according to claim 14, further comprising the step of;
combining a signal branched from the input of the power amplifier with a signal branched from the output of the power amplifier to form a feedback signal.

16. A method according to claim 15, further comprising the step of;
transitioning between the mutual share of the branched signals and their dominance in the feedback signal.

17. A method according to claim 11, further comprising the step of;
compensating for the non linear connection between the supply current and the output power with an exponential compensation function implemented in said compensation circuit which corrects the analog signal to an amplitude control value signal.

18. A radio transmitter for transmission of an information signal over a radio channel, said transmitter has a transmitter stage having a power amplifier with a current supply, a conversion device and an amplifier control device, said transmitter also comprising;
a power detector;
said power detector connected to the current supply of the power amplifier to register the current consumption, to form a true value signal and emit the true value signal to said amplifier control device;
said amplifier control device generating a control signal as a function of the true value signal, an amplitude component signal which is a component of an information signal and a control value indicating the desired output power from the power amplifier.

19. A radio transmitter for transmitting an information signal over a channel according to claim 18, wherein said power amplifier, said power detector and said amplifier control device form a closed loop.

20. A radio transmitter according to claim 18, wherein said conversion device for phase locking and frequency conversion comprises a low-noise high-power voltage controlled oscillator.

21. The radio transmitter according to claim 18, wherein the power amplifier is non-linear.

* * * * *